(12) United States Patent
Mori

(10) Patent No.: US 7,217,972 B2
(45) Date of Patent: May 15, 2007

(54) SEMICONDUCTOR DEVICE

(75) Inventor: Katsumi Mori, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 149 days.

(21) Appl. No.: 10/876,560

(22) Filed: Jun. 28, 2004

(65) Prior Publication Data
US 2005/0029567 A1 Feb. 10, 2005

(30) Foreign Application Priority Data
Jun. 30, 2003 (JP) .............................. 2003-187454

(51) Int. Cl.
*H01L 29/788* (2006.01)

(52) U.S. Cl. .................... 257/315; 257/315; 257/314; 257/324; 257/E21.679

(58) Field of Classification Search ................ 257/298, 257/324, 325, 326, 316, 314, 315
See application file for complete search history.

(56) References Cited

U.S. PATENT DOCUMENTS 5,838,041 A * 11/1998 Sakagami et al. .......... 257/324
2003/0227047 A1* 12/2003 Hsu et al. ................... 257/314

* cited by examiner

*Primary Examiner*—Andy Huynh
*Assistant Examiner*—Thinh T Nguyen
(74) *Attorney, Agent, or Firm*—Oliff & Berridge, PLC

(57) ABSTRACT

A semiconductor storage device showing a good memory characteristic, and a manufacturing method thereof, includes a semiconductor layer, a stacked body including a first insulating layer, a charge trapping layer, and a second insulating layer that are provided above the semiconductor layer, a gate electrode provided above the stacked body, a side wall insulating layer provided at the side of the gate electrode, and impurity regions and provided in the semiconductor layer. The end surface of the stacked body is positioned outside the end surface of the gate electrode.

8 Claims, 4 Drawing Sheets

RELATED ART

SEMICONDUCTOR DEVICE

BACKGROUND OF THE INVENTION

1. Field of Invention

The present invention relates to an insulating-film trapping type non-volatile semiconductor storage device (hereinafter "MONOS") and a manufacturing method thereof.

2. Description of Related Art

As a semiconductor storage device capable of electrically writing and erasing, there has been a non-volatile semiconductor storage device, which can retain stored date even when power for a memory is eliminated. As such a semiconductor storage device, there is a MONOS type semiconductor storage device.

A MONOS type semiconductor storage device 1000 according to a related art example is shown in FIG. 9. In the semiconductor storage device 1000, a gate electrode 130 is formed above a semiconductor substrate 110 with an ONO film 120 therebetween. A thermal oxide film 132 is formed on a side surface of the gate electrode 130, and a surface of the semiconductor substrate 110 where a side wall insulating layer 140 is formed. In the semiconductor substrate 110, impurity layers 150 and 152 having an LDD structure are formed at the side of the gate electrode 130.

SUMMARY OF THE INVENTION

In the above semiconductor storage device, the thermal oxide film 132 serves to recover damage due to etching when patterning the gate electrode, and restore crystal defect. This thermal oxide film 132, however, is not formed on a side surface of the ONO film 120. Specifically, etching damage and crystal defect caused on the end surface of the ONO film 120 are not recovered. This contributes to loss of trapped charges such that there is the case where electrons are not trapped well. Thus, a memory characteristic is desired to be further enhanced.

The present invention provides a semiconductor storage device showing a good memory characteristic, and a manufacturing method thereof.

(1) A semiconductor storage device of one aspect of the invention includes: a semiconductor layer; a stacked body including a first insulating layer, a charge trapping layer, and a second insulating layer that are provided above the semiconductor layer; a gate electrode provided above the first stacked body; a side wall insulating layer provided at the side of the gate electrode; and an impurity region provided in the semiconductor layer. An end surface of the stacked body is positioned outside an end surface of the gate electrode.

In the semiconductor storage device according to an aspect of the present invention, charges are trapped into the charge trapping layer in the vicinity of the end surface of the gate electrode, and thereby writing is implemented. It therefore is preferable that there is no etching damage and crystal fault around the position where charges are trapped. According to the semiconductor storage device of an aspect of the invention, the end surface of the stacked body is positioned outside the end surface of the gate electrode such that the end surface of the charge trapping layer is provided at the position distant from a position where charges are trapped when writing. Accordingly, a MONOS type semiconductor storage device with high reliability that can reduce loss of charges, even in the case where damage is caused in the end surface of the charge trapping layer, can be provided.

The present invention can apply to the following aspects for example.

(A) In the semiconductor storage device of an aspect of the invention, the distance between the end surface of the stacked body and the end surface of the gate electrode may be equal to, or more than, ten nanometers.

(B) In the semiconductor storage device of an aspect of the invention, the end surface of the stacked body may be flush with an end surface of the side wall insulating layer.

(C) In the semiconductor storage device of an aspect of the invention, the end surface of the stacked body may be positioned between the end surface of the gate electrode and the end surface of the side wall insulating layer.

(D) In the semiconductor storage device of an aspect of the invention, a protective layer may be provided between the gate electrode and the side wall insulating layer.

(E) In the semiconductor storage device of an aspect of the invention, the protective layer may be an oxide film.

(2) A method of manufacturing a semiconductor storage device of another aspect of the invention includes: forming a stacked film by stacking a first insulating layer, a charge trapping layer, and a second insulating layer sequentially above a semiconductor layer; forming a gate electrode above the stacked film by forming a conductive layer above the stacked film and patterning the conductive layer; forming a side wall insulating layer at the side of the gate electrode by depositing a third insulating layer over the whole surface of the semiconductor layer and implementing anisotropic etching for the third insulating layer; forming a stacked body by etching the stacked film with utilizing the side wall insulating layer as a mask; and forming an impurity layer in the semiconductor layer.

According to a method of manufacturing a semiconductor storage device of an aspect of the invention, the stacked body is formed by etching the stacked film while utilizing the side wall insulating layer as a mask. The end surface of the charge trapping layer therefore is provided at a position distant by a given length from the side surface of the gate electrode. In the semiconductor storage device according to an aspect of the present invention, charges are trapped into the charge trapping layer around the side surface of the gate electrode, and thereby writing is implemented. It therefore is preferable that there is no damage, such as crystal defect in the charge trapping layer in the vicinity of the position where charges are trapped. According to a method of manufacturing a semiconductor storage device of an aspect of the invention, the end surface of the charge trapping layer can be formed at a position distant from the position where charges are trapped when writing. Accordingly, a non-volatile semiconductor storage device with high reliability that can reduce loss of charges even in the case where damage is caused in the end surface of the charge trapping layer, can be manufactured.

(3) A method of manufacturing a semiconductor storage device of another aspect of the invention includes: forming a stacked film by stacking a first insulating layer, a charge trapping layer, and a second insulating layer sequentially above a semiconductor layer; forming a gate electrode above the stacked film by forming a conductive layer above the stacked film and patterning the conductive layer; forming a stacked body by patterning the stacked film; forming a side wall insulating layer at the side of the gate electrode by depositing a third insulating layer over the whole surface of the semiconductor layer and implementing anisotropic etching for the third insulating layer; and forming an impurity layer in the semiconductor layer. The stacked body is formed so that an end surface of the stacked body is positioned outside an end surface of the gate electrode.

According to a method of manufacturing a semiconductor storage device of an aspect of the invention, the stacked body is formed in a manner of having a pattern different from that of the gate electrode. Specifically, the end surface of the stacked body is positioned with a given distance from the position of the side surface of the gate electrode. In the semiconductor storage device according to an aspect of the invention, charges are trapped into the charge trapping layer in the vicinity of the side surface of the gate electrode, and thereby writing is implemented. It therefore is preferable that there is no damage, such as crystal defect in the charge trapping layer in the vicinity of the position where charges are trapped. According to a method of manufacturing a semiconductor storage device of an aspect of the invention, the end surface of the charge trapping layer can be formed at a position distant from the position where charges are trapped when writing. Accordingly, a non-volatile semiconductor storage device with high reliability that can reduce loss of charges even in the case where damage is caused in the end surface of the charge trapping layer, can be manufactured.

The present invention can apply to the following aspects for example.

(A) In a method of manufacturing a semiconductor storage device of the invention, the distance between the end surface of the stacked body and the end surface of the gate electrode may be equal to, or more than, ten nanometers.

(B) In a method of manufacturing a semiconductor storage device of an aspect of the invention, the end surface of the stacked body may be positioned between the end surface of the gate electrode and an end surface of the side wall insulating layer.

(C) In a method of manufacturing a semiconductor storage device of as aspect of the invention, in the forming of the stacked body, the second insulating layer of the stacked body may be formed in a manner having at least such film thickness that the charge trapping layer of the stacked body is covered.

DETAILED DESCRIPTION OF EXEMPLARY EMBODIMENTS

Exemplary embodiments of the present invention will be described below.

1. Semiconductor Storage Device 1.1 First Exemplary Embodiment

Figure 1:
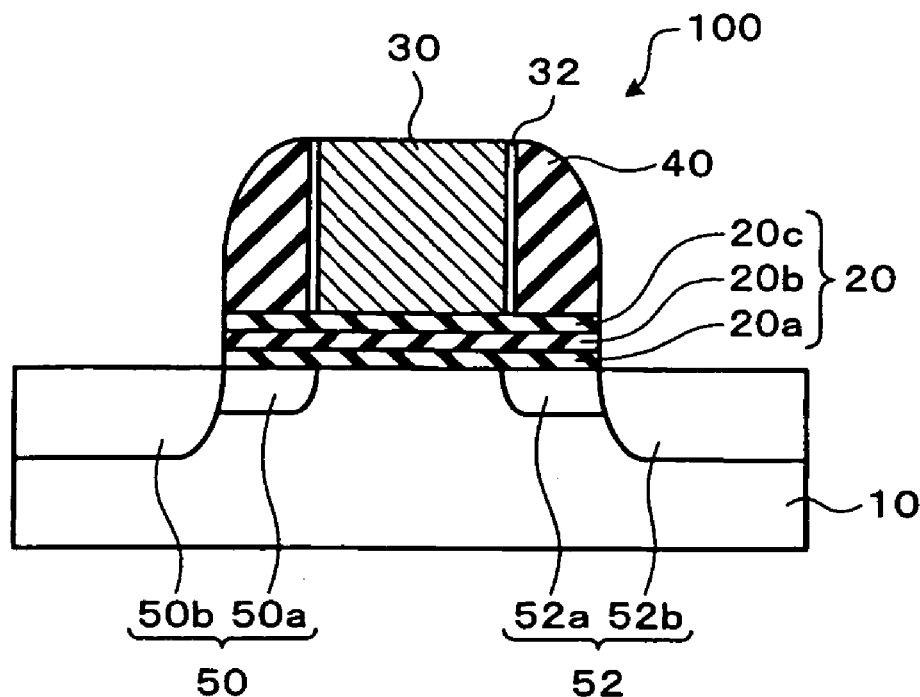
FIG. 1 is a schematic showing a semiconductor storage device according to an exemplary embodiment.

FIG. 1 is a schematic showing a semiconductor storage device according to a first exemplary embodiment. In a semiconductor storage device 100, a stacked body 20 including a first insulating layer 20a, a charge trapping layer 20b, and a second insulating layer 20c is formed above a semiconductor substrate 10, which is a semiconductor layer. A gate electrode 30 is formed above the stacked body 20. A side wall insulating layer 40 is formed over a side surface of the gate electrode 30 with a protective film 32 therebetween. The end surface of the stacked body 20 is positioned outside the end surface of the gate electrode 30. In the present exemplary embodiment, the case where the end surface of the stacked body 20 is flush with the end surface of the side wall insulating layer 40 is exemplified. In the semiconductor substrate 10, a source region 50 and a drain region 52 having an LDD structure are provided.

1.2 Second Exemplary Embodiment

A semiconductor storage device 110 according to a second exemplary embodiment will be described referring to FIG. 2. The semiconductor storage device 10 according to the second exemplary embodiment is an example where the width of the stacked body 20 is different from that of the semiconductor storage device 100 according to the first exemplary embodiment. For the same members, the same numerals are given, and detailed description will be omitted.

Figure 2:
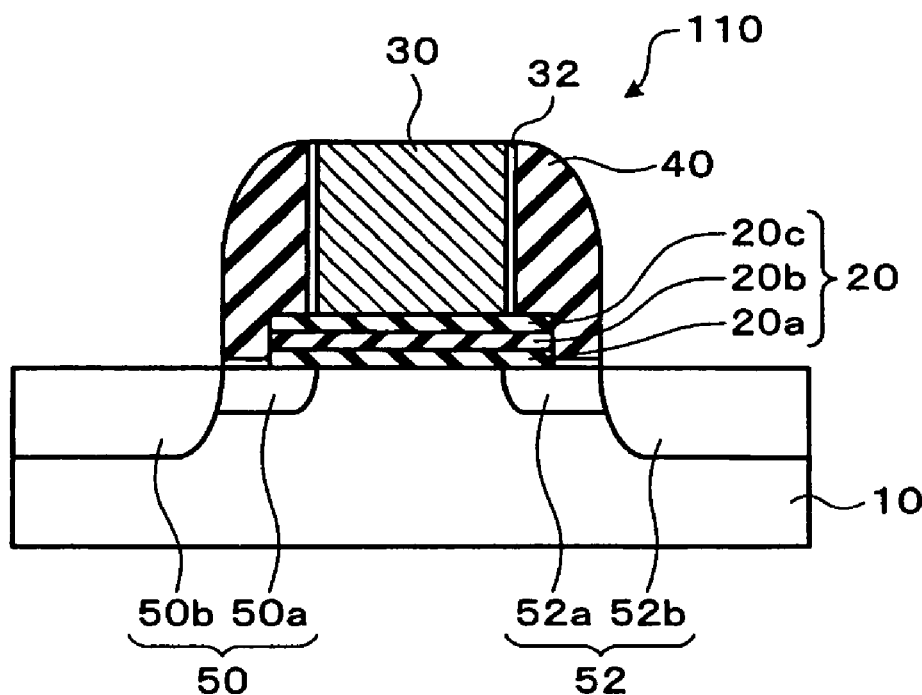
FIG. 2 is a schematic showing a semiconductor storage device according to a modification.

In the semiconductor storage device 10 shown in FIG. 2, the end surface of the stacked body 20 is positioned outside the end surface of the gate electrode 30. The width of the stacked body 20 is smaller than the width of the under surface of the side wall insulating layer 40. The distance between the end surface of the stacked body 20 and the end surface of the gate electrode 30 may be 10 nanometers or more. When the distance between the end surface of the stacked body 20 and the end surface of the gate electrode 30 is smaller than 10 nanometers, the distance is equal to or smaller than the mean free path of electrons such that it becomes possible for charges to move under the effect of crystal default caused on an side surface of the stacked body 20. As a result, loss of charges can not be prevented sufficiently. Furthermore, in the case where the semiconductor storage device is formed so that the end surface of the stacked body 20 is flush with the end surface of the side wall insulating layer 40, as in the first exemplary embodiment, the distance between the end surface of the stacked body 20 and the end surface of the gate electrode 30 may be 200 nanometers or less. The reason for this is that, in the case where the distance between the end surface of the stacked body 20 and the end surface of the gate electrode 30 is above 200 nanometers in such an exemplary embodiment, advantageous effects of the LDD structure can not be displayed sufficiently such that the deterioration of characteristic of a MOS transistor is caused.

The second insulating layer 20c, which is the top layer in the stacked body 20, has only to have at least such film thickness that a surface of the charge trapping layer 20b can be covered.

2. Operating Method of Memory

An operating method of the semiconductor storage device of an aspect of the present invention will be described. For example, the writing operation of the semiconductor storage device shown in FIG. 1 is implemented as follows. The voltage for the source is set to be 0 V. Appropriate positive voltage is applied to the drain and the control gate so as to turn on the transistor. Thereby hot electrons generated in the vicinity of the drain are injected. The electrons are trapped into a silicon nitride film, implementing writing. The erasing operation is implemented as follows. The erasing operation where the electrons, trapped into the silicon nitride film, are extracted, is implemented by tunnel emission toward a substrate, source, or drain side, or by neutralization of charges by injection of hot holes from the vicinity of the drain. For example, the voltages of 7 V, −3 V, and 3 V are applied to the drain, control gate, and source, respectively, so as to inject hot holes due to tunnel phenomenon between bands caused in the substrate in the vicinity of the drain, into the silicon nitride film. Thereby the erasing operation is implemented.

Figure 3:
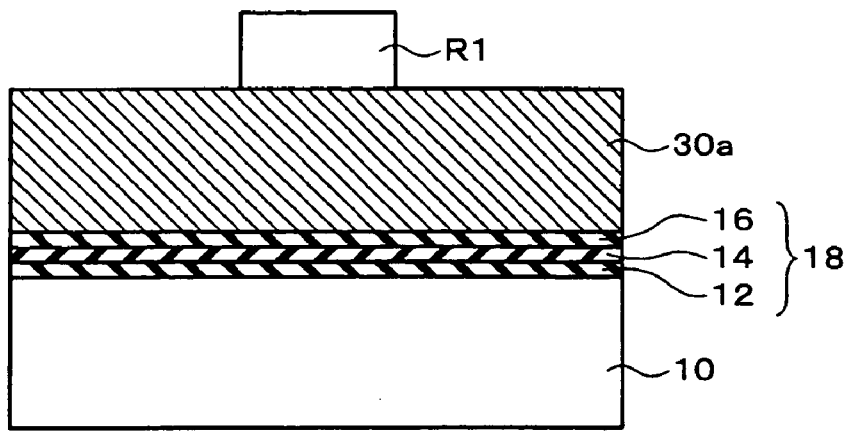
FIG. 3 is a schematic showing a manufacturing process of the semiconductor storage device shown in FIG. 1.
Figure 4:
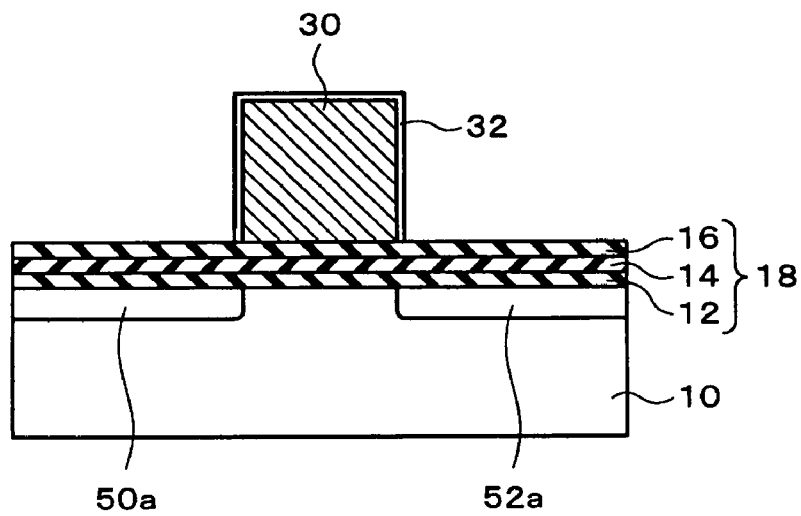
FIG. 4 is a schematic showing a manufacturing process of the semiconductor storage device shown in FIG. 1.
Figure 5:
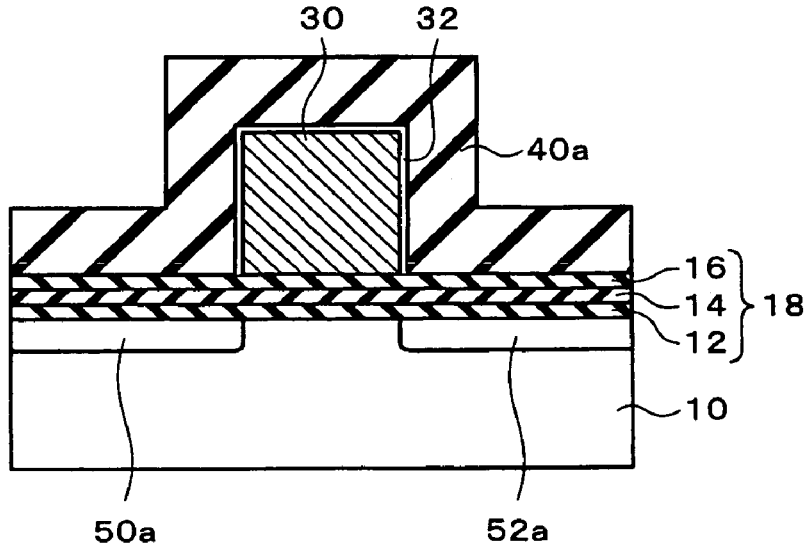
FIG. 5 is a schematic showing a manufacturing process of the semiconductor storage device shown in FIG. 1.

3. Method of Manufacturing Semiconductor Storage Device 3.1 First Exemplary Embodiment A method of manufacturing the semiconductor storage device shown in FIG. 1 will be described with reference to FIGS. 3 through 5. Each sectional view corresponds to the sectional view shown in FIG. 1. In FIGS. 3 through 5, the same numerals are given to the elements which are substantially the same as those shown in FIG. 1, and the overlapping description will be omitted.

(1) First, a stacked film 18 including a first insulating layer, a charge trapping layer, and a second insulating layer is formed on a surface of the semiconductor layer 10 (refer to FIG. 3). As the stacked film 18, an ONO film is formed.

In the forming of the stacked film 18, first, a first insulating layer 12 composed of oxide silicon is formed on a surface of the semiconductor substrate 10, which is a semiconductor layer, by a thermal oxidation method. A CVD method, instead of a thermal oxidation method, may be used for the formation of the first insulating layer 12.

Next, an annealing treatment is implemented for the first insulating layer 12. The annealing treatment is implemented in an atmosphere including an $NH_3$ gas. Because of this pretreatment, when a charge trapping layer 14 composed of nitride silicon is deposited on the first insulating layer 12 composed of oxide silicon, the charge trapping layer 14 can easily be deposited uniformly. Then, the charge trapping layer 14 composed of nitride silicon is deposited by a CVD method.

Next, a second insulating layer 16, composed of oxide silicon, is formed by a CVD method for example. The second insulating layer 16 can also be formed using ISSG (In-Situ stream Generation) treatment. A film formed by ISSG treatment is dense. In the case of depositing by ISSG treatment, annealing treatment to enhance an ONO film to be described later can be omitted.

In the above process, by depositing the charge trapping layer 14 and the second insulating layer 16 in the same furnace, pollution of the interface, caused by bringing the device out of the furnace, can be reduced or prevented. This enables an ONO film having a uniform film quality to be formed. Thus, a semiconductor storage device having a good characteristic can be obtained. Furthermore, a cleaning process to remove the pollution of the interface becomes unnecessary such that the number of processes can be reduced.

After these layers are deposited, the denseness of each layer may be enhanced by implementing annealing treatment by wet oxidation or LMP oxidation for example. The stacked layer 18 is obtained as shown in FIG. 3 through the above processes.

Then, a conductive layer 30a is deposited on the stacked film 18. As the conductive layer 30a, for example, a poly-silicon layer can be formed. Next, the gate electrode 30 is formed by patterning the conductive layer 30a. Specifically, first, a resist layer R1 having a given pattern is formed on the conductive layer 30a.

(2) Next, the conductive layer 30a is etched utilizing the resist layer R1 (refer to FIG. 3) as a mask as shown in FIG. 4. According to this, the gate electrode 30 having a given pattern is formed on the first stacked body 18. Then, impurity regions 50a and 52a are formed in the semiconductor layer 10. The impurity regions 50a and 52a are formed by implanting an impurity of a given conductive type while utilizing at least the gate electrode 30 as a mask.

Next, a protective film 32 is formed on an exposed surface of the gate electrode 30. The protective film 32 is formed by a thermal oxidation method for example. By forming the protective film 32 as described, etching damage and so on, caused when patterning the gate electrode 30, can be recovered.

(3) Next, the side wall insulating layer 40 is formed on both side walls of the gate electrode 30 (refer to FIG. 1). In the forming of the side wall insulating layer 40, first, a third insulating layer 40a to form the side wall insulating layer 40 is formed over the whole surface. Next, anisotropic etching is implemented for the third insulating layer 40a. According to this, the side wall insulating layer 40 is formed on both side walls of the gate electrode 30. Then, the stacked film 18 is etched utilizing the side wall insulating layer 40 as a mask. Thereby the stacked body 20 including the first insulating layer 20a, the charge trapping layer 20b, and the second insulating layer 20c is formed. Thus, the stacked body 20, whose end surface is flush with the end surface of the side wall insulating layer 40, can be formed.

Next, impurity regions 50b and 52b are formed in the semiconductor substrate at the side of the side wall insulating layer 40. Specifically, the impurity regions 50b and 52b are formed by implanting an impurity of a given conductive type with utilizing the side wall insulating layer 40 as a mask. The impurity concentration of the impurity regions 50b and 52b are set to be higher than that of the impurity region 50a, which has been already formed. This enables the impurity regions 50 and 52 having an LDD structure to be formed. Through the above processes, the semiconductor storage device according to the present exemplary embodiment can be manufactured.

3.2 Second Exemplary Embodiment

Figure 7:
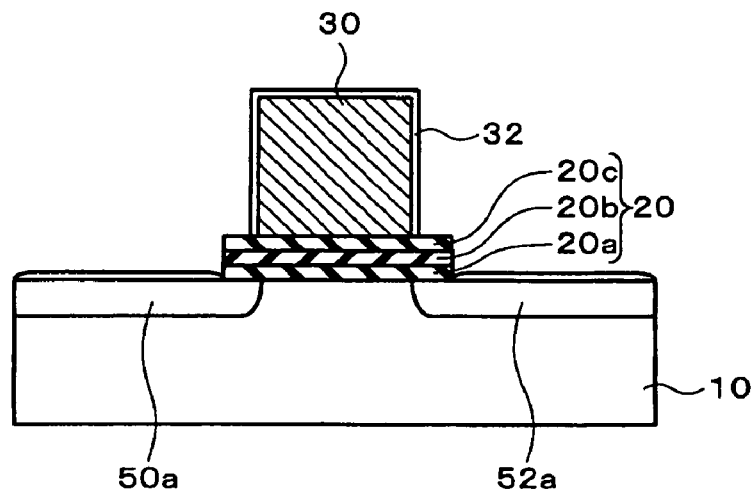
FIG. 7 is a schematic showing a manufacturing process of the semiconductor storage device shown in FIG. 2.
Figure 8:
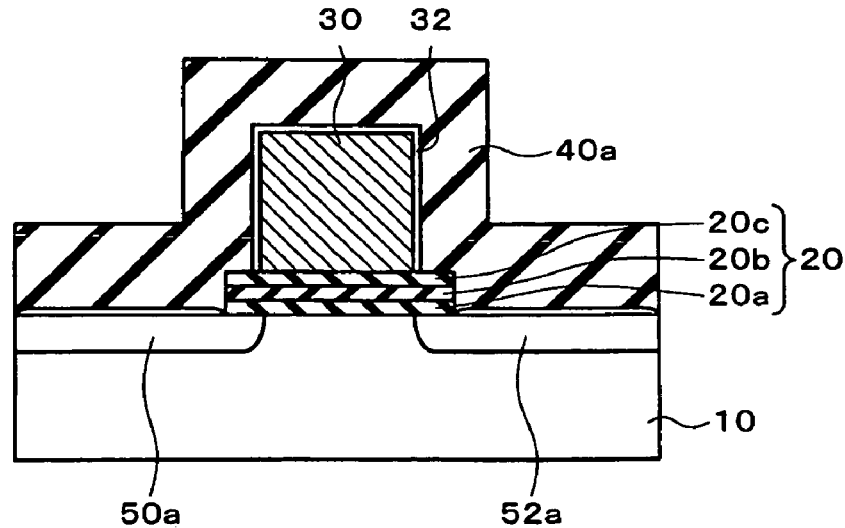
FIG. 8 is a schematic showing a manufacturing process of the semiconductor storage device shown in FIG. 2.
Figure 9:
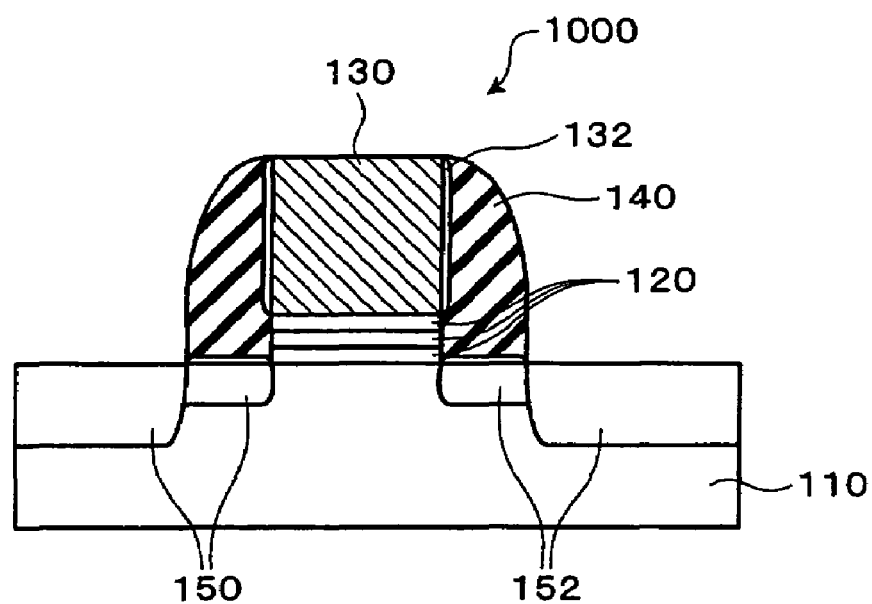
FIG. 9 is a schematic showing a semiconductor storage device according to a related art example.

A method of manufacturing a semiconductor storage device according to a second exemplary embodiment will be described with reference to FIGS. 6 through 8. With respect to processes that can be implemented in the same way as the first exemplary embodiment, detailed description will be omitted.

(1) First, as shown in FIG. 4, the gate electrode 30 having a given pattern is formed on the stacked film 18 where the first insulating layer 12, the charge trapping layer 14, and the second insulating layer 16 are stacked, to each other as with the above exemplary embodiment.

Figure 6:
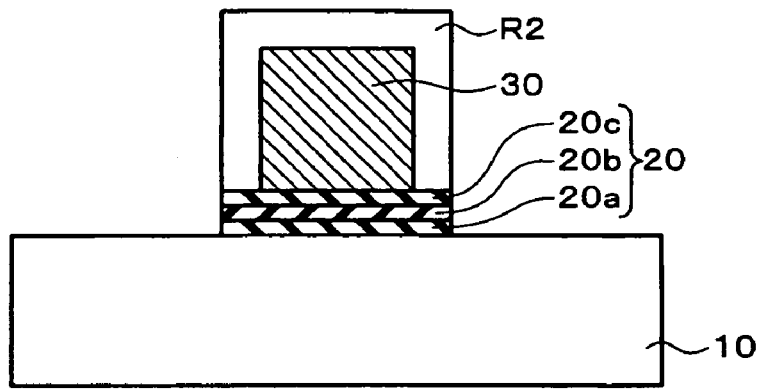
FIG. 6 is a schematic showing a manufacturing process of the semiconductor storage device shown in FIG. 2.

(2) Then, as shown in FIG. 6, a mask layer is formed in a manner of covering part of the stacked film 18 formed of the first insulating layer 12, the charge trapping layer 14 and the second insulating layer 16, and the gate electrode 30. As the mask layer, a resist layer R2 is formed, for example, as shown in FIG. 6. Then, the stacked film 18 is etched utilizing the resist layer R2 as a mask. According to this, the stacked body 20 formed of the first insulating layer 20a, the charge trapping layer 20b, and the second insulating layer 20c is formed. The stacked body 20 is formed so that the end surface thereof is positioned outside the end surface of the gate electrode 30.

(3) Next, the impurity regions 50a and 52a are formed in the semiconductor layer 10. The impurity regions 50a and 52a are formed by implanting an impurity of a given conductive type while utilizing at least the gate electrode 30 as a mask. Next, the protective film 32 is formed on an exposed surface of the gate electrode 30 and the semiconductor layer 10 as shown in FIG. 7. The protective film 32 can be formed in the same way as the above exemplary embodiment, so can be formed by a thermal oxidization method.

(4) Next, the side wall insulating layer 40 is formed over the side surface of the gate electrode 30 (refer to FIG. 2). The forming of the side wall insulating layer 40 is implemented by forming the third insulating layer 40a covering the whole surface as shown in FIG. 8, for example. Then, the side wall insulating layer 40 is formed over the side surface of the gate electrode 30 by implementing anisotropic etching. The side wall insulating layer 40 is formed in a manner of interposing the stacked body 20 between the semiconductor layer 10 and part of the side wall insulating layer 40. Next, as with the above exemplary embodiment, an impurity of a given conductivity type is implanted into the semiconductor layer 10 while utilizing the side wall insulating layer 40 as a mask so as to form the impurity regions 50b and 52b. According to this, the impurity regions 50 and 52 having an LDD structure are formed. Through the above processes, the semiconductor storage device 110 according to the second exemplary embodiment can be manufactured.

The advantages of the semiconductor storage device and the manufacturing method thereof according to the exemplary embodiments will be described.

(A) According to the semiconductor storage devices 100 and 110 of the exemplary embodiments, the stacked body 20 is provided under the gate electrode 30. The end surface of the stacked body 20 is positioned outside the end surface of the gate electrode 30. In the semiconductor storage devices 100 and 110 according to the exemplary embodiments, charges are trapped into the charge trapping layer 20b in the vicinity of the end surface of the gate electrode 30, and thereby writing is implemented. In this case, if etching damage and damage, such as a crystal defect, exist in the vicinity of the charge trapping layer 20b where charges have been trapped, the trapped charges may disappear such that the deterioration of a memory characteristic may be caused.

In the semiconductor storage devices 100 and 10 of the exemplary embodiments, however, the end surface of the stacked body 20 is positioned outside the end surface of the gate electrode 30. Thus, in the vicinity of the end surface of the gate electrode 30, the end surface of the charge trapping layer 20b is not exposed to outside such that crystal defect due to etching damage is not caused. As a result, the trapped charges can be retained such that a non-volatile semiconductor storage device with high reliability can be provided.

(B) According to a method of manufacturing a semiconductor storage device of the embodiments, the gate electrode 30 is formed above the stacked body 20, and the end surface of the stacked body 20 can be positioned outside the end surface of the gate electrode 30. In the semiconductor storage devices obtained by a manufacturing method according to the exemplary embodiments, charges are trapped into the charge trapping layer 20b in the vicinity of the end surface of the gate electrode 30, and thereby writing is implemented. It therefore is preferable that there is no damage, such as crystal defect, in the charge trapping layer 20b in the vicinity of the position where charges are trapped. According to the manufacturing method of the exemplary embodiment, the semiconductor storage device can be formed so that the end surface of the charge trapping layer 20b is located at a position distant from the position where charges are trapped when writing. As a result, loss of the trapped charges can be reduced or prevented such that a semiconductor storage device whose reliability is enhanced can be manufactured.

What is claimed is:

1. A semiconductor storage device, comprising:
   a semiconductor layer;
   a stacked body including a first insulating layer, a charge trapping layer, and a second insulating layer that are provided above the semiconductor layer;
   a gate electrode provided above the stacked body;
   a side wall insulating layer provided at a side of the gate electrode; and
   an impurity region provided in the semiconductor layer,
   an end surface of the stacked body being positioned outside an end surface of the gate electrode, an end surface of the first insulating layer, an end surface of the charge trapping layer, and an end surface of the second insulating layer being positioned between the end surface of the gate electrode and an end surface of the side wall insulating layer. the distance between the end surface of the stacked body and the end surface of the gate electrode being equal to or more than ten nanometers.

2. The semiconductor storage device according to claim 1, the end surface of the stacked body being flush with an end surface of the side wall insulating layer.

3. The semiconductor storage device according to claim 1, a protective layer being provided between the gate electrode and the side wall insulating layer.

4. The semiconductor storage device according to claim 3, the protective layer being an oxide film.

5. A semiconductor storage device, comprising:
   a semiconductor layer;
   a stacked body including a first insulating layer, a charge trapping layer, and a second insulating layer that are provided above semiconductor layer;
   a gate electrode provided above the stacked body;
   a side wall insulating layer provided at a side of the gate electrode; and
   an impurity region provided in the semiconductor layer,
   an end surface of the stacked body being positioned outside an end surface of the gate electrode, an end surface of the first insulating layer, an end surface of the charge trapping layer, and an end surface of the second insulating layer being positioned between the end surface of the gate electrode, and an end surface of the side wall insulating layer, the distance between the end surface of the stacked body and the end surface of the gate electrode being more than 30 nanometers.

6. The semiconductor storage device according to claim 5, the end surface of the stacked body being flush with an end surface of the side wall insulating layer.

7. The semiconductor storage device according to claim 5, a protective layer being provided between the gate electrode and the side wall insulating layer.

8. The semiconductor storage device according to claim 7, the protective layer being and oxide film.

* * * * *